United States Patent
Mollov et al.

(10) Patent No.: US 10,367,497 B2
(45) Date of Patent: Jul. 30, 2019

(54) SYSTEM COMPRISING MULTI-DIE POWER AND METHOD FOR CONTROLLING OPERATION OF MULTI-DIE POWER MODULE

(71) Applicant: MITSUBISHI ELECTRIC CORPORATION, Tokyo (JP)

(72) Inventors: Stefan Mollov, Rennes (FR); Jeffrey Ewanchuk, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 19 days.

(21) Appl. No.: 15/574,632

(22) PCT Filed: Jun. 15, 2016

(86) PCT No.: PCT/JP2016/068448
§ 371 (c)(1),
(2) Date: Nov. 16, 2017

(87) PCT Pub. No.: WO2016/204305
PCT Pub. Date: Dec. 22, 2016

(65) Prior Publication Data
US 2018/0138901 A1  May 17, 2018

(30) Foreign Application Priority Data

Jun. 16, 2015 (EP) .................... 15172320

(51) Int. Cl.
*H02M 1/088* (2006.01)
*H03K 17/12* (2006.01)
*H03K 17/14* (2006.01)

(52) U.S. Cl.
CPC ............ *H03K 17/14* (2013.01); *H02M 1/088* (2013.01); *H03K 17/122* (2013.01); *H03K 17/145* (2013.01)

(58) Field of Classification Search
CPC ..... H02M 1/088; H03K 17/12; H03K 17/122; H03K 17/14; H03K 17/145
USPC .................................. 307/11, 18, 29, 38, 40
See application file for complete search history.

(56) References Cited

U.S. PATENT DOCUMENTS

| | | | | |
|---|---|---|---|---|
| 4,977,333 A | * | 12/1990 | Suzuki | ...................... G05F 3/22 |
| | | | | 257/E27.06 |
| 2005/0212497 A1 | | 9/2005 | Cha | |

FOREIGN PATENT DOCUMENTS

EP    0 581 016 A1   2/1994

* cited by examiner

*Primary Examiner* — William Hernandez
(74) *Attorney, Agent, or Firm* — Birch, Stewart, Kolasch & Birch, LLP (57) ABSTRACT

The present invention concerns a system comprising a multi-die power module composed of dies and a controller receiving plural consecutive input patterns for activating the dies of the multi-die power module, wherein the dies are grouped into plural groups of at least one die and in that the controller comprises: —means for outputting one gate to source signal for each group of at least one die, the rising edges and/or falling edges of at least one gate to source signal being iteratively time shifted from the rising edge and/or a falling edge of the other gate to source signals for other groups of dies.

10 Claims, 6 Drawing Sheets

SYSTEM COMPRISING MULTI-DIE POWER AND METHOD FOR CONTROLLING OPERATION OF MULTI-DIE POWER MODULE

TECHNICAL FIELD

The present invention relates generally to a system and method for controlling the operation of a multi-die power module.

BACKGROUND ART

Multi-die power modules are classically composed of several parallel connected power dies and are used for increasing the current capability over that of a single power die.

For example, a three-phase converter can be composed of four parallel power dies per switch, giving twenty four power dies in total.

Emerging devices technologies, such as SiC (Silicon Carbide) and GaN (Gallium Nitride) Transistors, are typically realized in high current density, small power dies due to limitations of yield and cost of wafer substrate.

In order to realize higher power SiC-based modules, a multitude of parallel connected SiC dies is necessary. Unlike parallel connected modules, parallel connected dies constitute a single switch that ideally commutates the same load current.

SUMMARY OF INVENTION

However, regardless of the type of die used, i.e. diodes or voltage-driven switch, e.g. MOSFETs (Metal Oxide Semiconductor Field Effect Transistor), characteristics exist within the dies that limit the balanced sharing of the load current both statically and dynamically. The incremental addition of each parallel die does not result in full utilization of the die, and thus, more dies are needed in parallel to achieve a given current rating, thereby increasing the overall costs and physical surface area of the power module.

Due to variations in the electrical characteristics of power devices during manufacturing, the currents are not equally shared across the dies and can be especially unbalanced during switching transitions. Thus, as commutation speeds are increasing with newer technologies, such as SiC and GaN, this dynamic sharing challenge has only increased in severity.

One key electrical characteristic for the switching transient is the threshold voltage of a given voltage-controlled power die herein called 'the die'. For normally-off die, when the voltage across source and gate connector of a die is below that level, the die channel does not conduct. Above that level, the die starts conducting. When the threshold voltages are not perfectly matched across a set of parallel dies controlled with same gate voltage, the currents are not equally shared across these dies during the switching transient. As a result, the switching losses can significantly differ across parallel dies, leading to undesired temperature imbalance across dies, and eventually, early aging of the most stressed die.

Typically, the number of parallel dies per logically equivalent switch in a multi-die power module is a function of the desired current rating, the peak power dissipation of the multi-die power module package and the thermal rating of the dies within the package. Once the number of dies is set, the actual losses in the multi-die power module are related to the number N of parallel IGBT or MOSFET dies as:

$$P\text{cond}(N) \propto 1/N$$

$$P\text{switching}(N) \propto N$$

Where Pcond(N) is the power when the N dies are conducting and Pswitching(N) is the power when the N dies are switching.

Then, the total power is Ptotal(N)=Pcond(N)+Pswitching(N)

In this manner, a given current rating for a multi-die power module has minimal loss point that is dependent on the number N of dies, and the operating conditions, i.e. frequency and blocking voltage.

While the conduction losses can be decreased via adding more dies in parallel, i.e. to meet the static current requirements, this increase of dies results in more parallel capacitances at each node and increases switching losses.

Hence, for a given set of dies that meet a static current capability, the switching energy is fixed and the power losses can only be reduced via lower switching frequencies.

State of the art multi-die power modules can only allow for a modification in gate driving voltage or gate resistance to change the commutation time and the number of parallel dies largely limits the dynamic performance of the multi-die power module.

Ignoring the reverse recovery of the diode in a complementary switch pair and its influence on the total conducting current, the turn off and turn on times of a voltage-controlled die can essentially be modelled as capacitor charging event with the current rise time during a turn on event is as follows:

$$tri = Rg \cdot Ciss \cdot \ln\left(\frac{Vgs_{on} - Vth}{Vgs_{on} - gfs^{-1}I_D}\right)$$

Where, 'Rg' is the gate resistance, 'Ciss' is the input capacitance, $Vgs_{on}$ is the applied gate voltage, 'Vth' is the threshold voltage, 'gfs' is the transconductance of the die and $I_d$ is the drain current.

Accordingly, where the plateau voltage ($gfs^{-1}Id$) is much smaller than the applied gate voltage, an increase in current results in an approximately linear increase in the rise time of the current with a similar relationship for the current fall time and voltage rise/fall times.

Figure 2A:
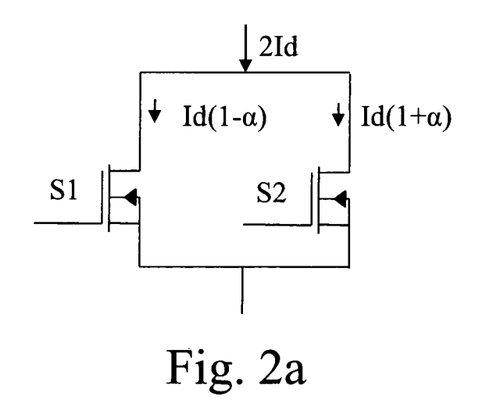
FIG. 2a is an example of a multi-die power module wherein two dies are connected in parallel.
Figure 2B:
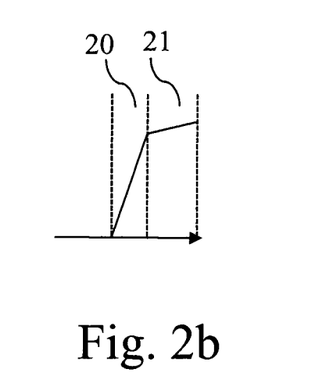
FIG. 2b shows the currents going through the dies when the dies switch at different timings.

The example given is in reference to FIGS. 2a and 2b.

The FIG. 2a is an example of a multi-die power module wherein two dies S1 and S2 are connected in parallel. When the dies are both conducting, the die S1 has a current equal to Id(1−α) and the die S2 has a current equal to Id(1−α), where 'α' is the per-unit difference between the magnitude of commutated current.

Under the case where the plateau voltage is much smaller than the applied voltage, when one die has a current of $2I_d$ and the other no current, the global switching losses between the two dies are approximately equal to the case where they both carry the same drain current. However, if the input capacitance was to change between the two cases, i.e. reduced in the case where one die is loaded entirely, the switching losses could actually decrease globally compared to two equally loaded dies due to a lowering of the current rise time in the active device.

FIG. 2b shows the currents going through the dies when the dies switch at different timings.

During the time period noted 20, the die S2 is turned ON and during the time period noted 21, the dies S1 and S2 are turned ON.

Typically, as seen in FIG. 2, if in the case of two parallel MOSFET dies, the input capacitance seen by the gate driver is the sum of both of the dies, and hence the switching losses are a function of these parameters given a limited gate supply voltage.

In this case, the two commutating dies, due to differing threshold voltages, begin to conduct currents at different times, leading to a mismatch of current at time 't', and oscillatory behaviour as the current tries to balance between the two dies. These oscillations then result in an increase of the Electro Magnetic Interference.

The present invention aims at enhancing the switching speed of multi-die power modules and to increase the maximum capability of a multi-die power module by controlling switching transients for parallel-connected device without need to implement highly dynamic control.

To that end, the present invention concerns a system comprising a multi-die power module composed of dies and a controller receiving plural consecutive input patterns for activating the dies of the multi-die power module, characterized in that the dies are grouped into plural groups of at least one die and in that the controller comprises:

means for outputting one gate to source signal for each group of at least one die, the rising edges and/or falling edges of at least one gate to source signal being iteratively time shifted from the rising edge and/or a falling edge of the other gate to source signals for other groups of dies.

Thus, the commutation current can effectively be concentrated in a select group of dies or a single die in order to reduce oscillations and reduce the commutation time.

The present invention concerns also a method for controlling the operation of a multi-die power module composed of groups of dies characterized in that the method comprises the steps executed by a controller of:

receiving plural consecutive input patterns for activating the dies of the multi-die power module, outputting one gate to source signal for each group of at least one die, the rising edges and/or falling edges of at least one gate to source signal being iteratively time shifted from the rising edge and/or a falling edge of the other gate to source signals for other groups of dies.

According to a particular feature, the system further comprises means for adjusting the number of dies or groups of dies according to current requirement and maximum current driving capability of the dies of the multi-die power module.

Thus, the safe operating area of the power module is always ensured.

According to a particular feature, the system comprises further means for changing, at each input, patterns for activating the dies of the multi-die power module, of at least one gate to source signal of which the rising edge and/or a falling edge is time shifted.

Thus, the time shift can be adapted according to different parameters that influence the rising and falling time of the commutation current in the die.

According to a particular feature, the gate to source signals of which the rising edge and/or a falling edge are time shifted are changed on a round robin basis.

Thus, the individual dies are not overstressed over the lifetime of the power module.

According to a particular feature, the time shift occurrences are, at a minimum, dependent of the commutations properties of the dies and are at least ten times smaller than the total conduction time of the die.

Thus, a simple method exists to pre-determine the appropriate time shift to ensure proper operation without the need of feedback.

The characteristics of the invention will emerge more clearly from a reading of the following description of example embodiments, the said description being produced with reference to the accompanying drawings, among which:

DESCRIPTION OF EMBODIMENTS

Figure 1:
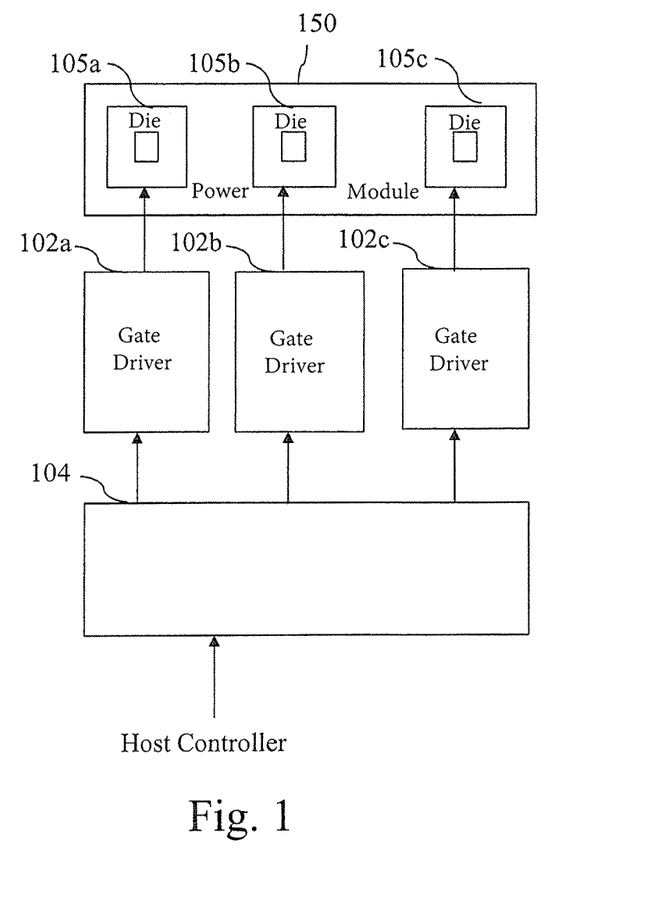
FIG. 1 represents an example of a system for controlling the operation of a multi-die power module according to the present invention.

FIG. 1 represents an example of a system for controlling the operation of a multi-die power module according to the present invention.

The system for controlling the operation of the multi-die power module 150 uses an open loop mechanism and controls the switching time of the dies in the multi-die power module 150.

The system for controlling the operation of the multi-die power module 150 comprises a plurality of gate drivers 102 for providing a driving signal to at least one or plural dies 105 of the multi-die power module 150.

In the example of FIG. 1, the system for controlling the operation of the multi-die power module 150 comprises three gate drivers 102a to 102c for controlling the operation of three groups of at least one power die.

In the example of FIG. 1, each group of at least one power die comprises one die, respectively noted 105a to 105c.

Figure 3:
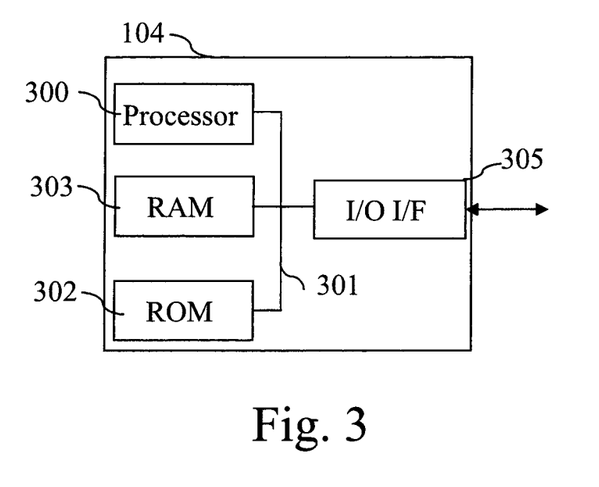
FIG. 3 represents an example of an architecture of a controller of the system for controlling the operation of a multi-die power module according to the present invention.

The gate drivers 102a to 102 receive command signal from a controller 104 which is disclosed in reference to FIG. 3.

FIG. 3 represents an example of an architecture of a controller of the system for controlling the operation of a multi-die power module according to the present invention.

Figure 6:
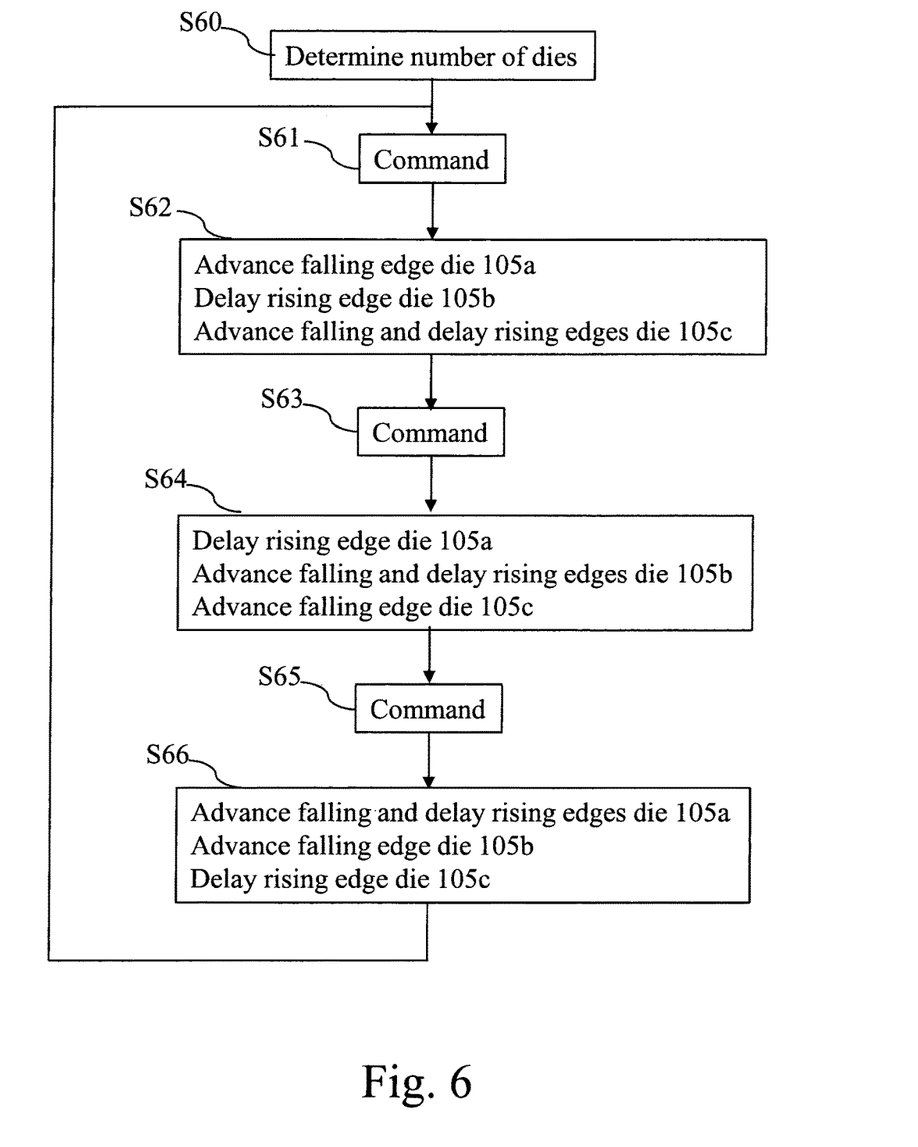
FIG. 6 is an example of an algorithm for controlling the switching time of the dies of a multi-power die module according to the present invention.

The controller 104 has, for example, an architecture based on components connected together by a bus 301 and a processor 300 controlled by the program as disclosed in FIG. 6.

The bus 301 links the processor 200 to a read only memory ROM 302, a random access memory RAM 303 and an input/output interface I/O 305.

The memory 303 contains registers intended to receive variables and the instructions of the program related to the algorithm as disclosed in FIG. 6.

The processor 300 receives command patterns from a host controller through the input/output interface 305, modifies the rising/falling edge times of the signal to be applied by the gate drivers 102 to the dies 105 and transfers them to the gate drivers 102 through the input/output interface 305.

The input/output interface I/O 205 may be split into two interfaces, one with the host controller and one with the device for controlling the operation of a power die 102.

Through the input/output interface 205, the controller 104 receives an activation or load command from a host controller. The controller 104 interprets this activation command and provides synchronized control over the plurality of dies.

The read only memory 302 contains instructions of the program related to the algorithm as disclosed in FIG. 6, which are transferred, when the controller 104 is powered on, to the random access memory 303.

Any and all steps of the algorithm described hereafter with regard to FIG. 6 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the controller 104 includes circuitry, or a device including circuitry, causing the controller 104 to perform the steps of the algorithm described hereafter with regard to FIG. 6.

The controller 104 may be realized, for example, by a pre-programmed CPLD (Complex Programmable Logic Device).

According to the invention, the dies are grouped into plural groups of at least one die and the controller comprises:
    means for outputting one gate to source signal for each group of at least one die, the rising edges and/or falling edges of at least one gate to source signal being iteratively time shifted from the rising edge and/or a falling edge of the other gate to source signals for other groups of dies.

Figure 4:
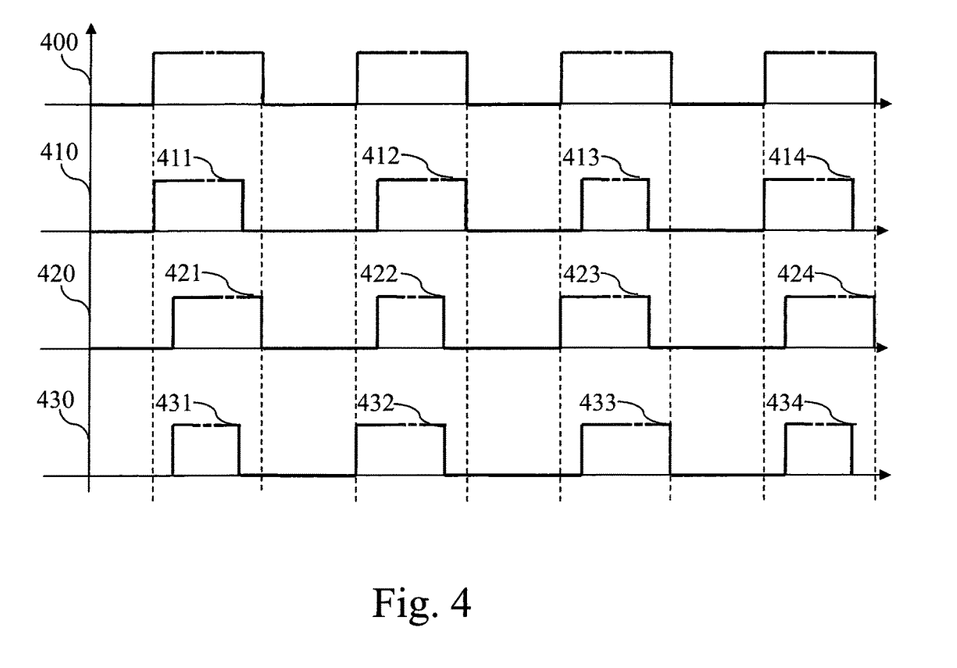
FIG. 4 represents an example of a control of the switching timing of a multi-die power module.

FIG. 4 represents an example of a control of the switching timing of a multi-die power module.

The controller 104 receives command patterns from the host controller. Command patterns are noted 400.

For example, the active time i.e. the high level state, of the control patterns are comprised between 2 microseconds to 10 microseconds.

The signal noted 410 is the signal provided to the gate driver 102a, the signal noted 420 is the signal provided to the gate driver 102b and the signal noted 430 is the signal provided to the gate driver 102c.

According to the invention, the controller 104 delays rising edge times, advances falling edge times on a round trip basis.

For example, at first high level state of the control pattern, the controller 104 generates a high level 411 for the signal 410 by advancing the falling edge time by a predetermined value, the controller 104 generates a high level 421 for the signal 420 by delaying the rising edge time by the predetermined value and the controller 104 generates a high level 431 for the signal 430 by delaying the rising edge time by the predetermined value and by advancing the falling edge time by the predetermined value.

At second high level state of the control pattern, the controller 104 generates a high level 412 for the signal 410 by delaying the rising edge time by the predetermined value, the controller 104 generates a high level 422 for the signal 420 by delaying the rising edge time by the predetermined value and by advancing the falling edge time by the predetermined value and the controller 104 generates a high level 432 for the signal 430 by advancing the falling edge time by the predetermined value.

At third high level state of the control pattern, the controller 104 generates a high level 413 for the signal 410 by delaying the rising edge time by the predetermined value and by advancing the falling edge time by the predetermined value, the controller 104 generates a high level 423 for the signal 420 by advancing the falling edge time by the predetermined value and the controller 104 generates a high level 433 for the signal 430 by delaying the rising edge time by the predetermined value.

The round robin cycle is repeated as shown by the high levels 414, 424 and 434 which are similar as the ones noted 411, 421 and 431.

The predetermined value is for example between 10 to 50 nanoseconds which correspond to the switching of the dies 105. It has to be noted here that this value is based on the transit delay and rise/fall times of the current in the specific die used in the multi-die power module. The predetermined value is at least ten times smaller than the total conduction time of each die.

Figure 5A:
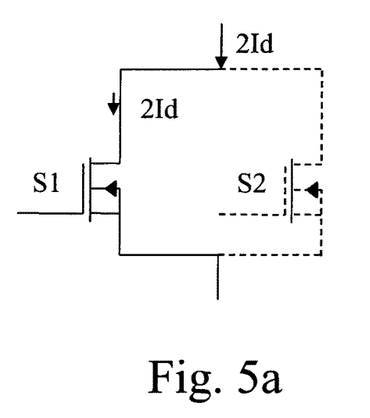
FIG. 5a is an example of a multi-die power module wherein two dies are connected in parallel and controlled according to the present invention.
Figure 5B:
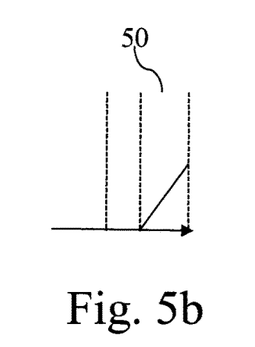
FIG. 5b shows the currents going through the dies when the dies switch at different timings according to the present invention.
Figure 5C:
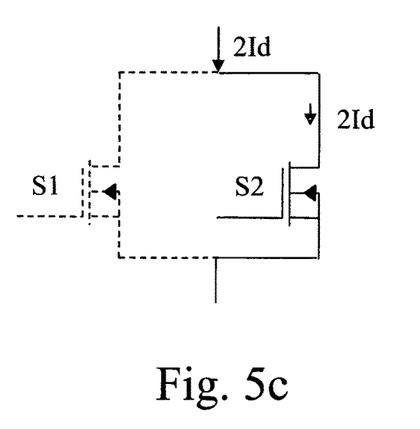
FIG. 5c is an example of a multi-die power module wherein two dies are connected in parallel and controlled according to the present invention.

FIGS. 5a and 5c are an example of a multi-die power module wherein two dies are connected in parallel and controlled according to the present invention.

In FIG. 5a, the die S1 is conducting and the die S2 is not conducting. In FIG. 5b, the die S2 is conducting and the die S1 is not conducting.

According to the present invention, by delaying or advancing the rising or falling edge time, it is possible to reduce the driving capacitance, as seen by the gate drivers. As one die is left inactive during the commutation event such that the active die has twice the rated current, the global losses can fall due to a decrease in current rise/fall times. The increase in current does not increase the losses compared to two conducting dies if the plateau voltage is small compared to the gate voltage, and thus by decreasing the input capacitance, the losses can fall due to a shortened equivalent commutation time.

Furthermore, a switching loss reduction is also achieved by negating the need for larger current sharing resistors that are typically added to improve stability during commutation by increasing the current rise and fall times within the controlled multi-die power module.

Figure 5D:
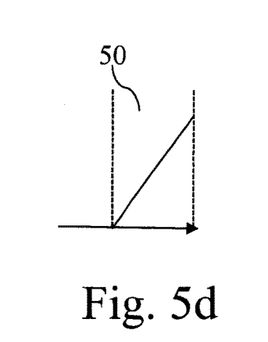
FIG. 5d shows the currents going through the dies when the dies switch at different timings according to the present invention.

An example of how sequencing the dies during commutation can improve the sharing is illustrated in FIGS. 5b and 5d.

FIGS. 5b and 5d show the currents going through the dies when the dies switch at different timings according to the present invention.

The FIG. 5b shows the commuting of the die S1 and the FIG. 5d shows the commuting of the die S2. According to the invention, by sequencing the dies S1 and S2, the currents do not oscillate during turn on, despite having different points where the current begins to conduct. These latter points therefore remove the need for current balancing resistors, and EMI problems due to oscillations and can equalize the wear on each device.

FIG. 6 is an example of an algorithm for controlling the switching time of the dies of a multi-power die module according to the present invention.

The present algorithm controls a multitude of parallel connected dies by decreasing the number of dies active during a commutation event and cycles the active dies from one high level command to another. The present algorithm is executed for three groups of dies as an example. The present invention is also applicable for a fewer or greater number of groups of dies.

Essentially, a number representing the optimal number of parallel dies for each switching event is pre-loaded into the controller 104.

The controller 104 receives the pulse width modulation command from the host controller, sets the number of active dies, and then delays the appropriate dies on the rising or turn-on event or advances the dies on the falling or turn off events to force current into the appropriate dies. The number of dies used in the given switching period is stored, and then for the next switching cycle, the new number of active dies is selected. The inactive dies are sequentially then moved to the next die in each cycle. In this manner, the active dies are cycled through to reduce the loading on the specific dies, caused by the increased current seen during commutation.

At step S60, the processor 300 determines the minimum number of dies of each group of dies. The minimum number is determined according to the current requirement and maximum current driving capability of the dies of the multi-die power module.

At next step S61, the processor 300 detects a high level state of the control pattern through the interface 305.

At next step S62, the processor 300 generates a high level for the signal intended to the first group of dies comprising the die 105a by advancing the falling edge time by the predetermined value, generates a high level for the signal intended to the second group of dies comprising the die 105b by delaying the rising edge time by the predetermined value and generates a high level for the signal intended to the first group of dies comprising the die 105c by delaying the rising edge time by the predetermined value and by advancing the falling edge time by the predetermined value.

At next step S63, the processor 300 detects a high level state of the control pattern through the interface 305.

At next step S64, the processor 300 generates a high level for the signal intended to the first group of dies comprising the die 105a by delaying the rising edge time by the predetermined value, generates a high level for the signal intended to the second group of dies comprising the die 105b by delaying the rising edge time by the predetermined value and by advancing the falling edge time by the predetermined value and generates a high level for the signal intended to the first group of dies comprising the die 105c by advancing the falling edge time by the predetermined value.

At next step S65, the processor 300 detects a high level state of the control pattern through the interface 305.

At next step S66, the processor 300 generates a high level for the signal intended to the first group of dies comprising the die 105a by delaying the rising edge time by the predetermined value and by advancing the falling edge time by the predetermined value, generates a high level for the signal intended to the second group of dies comprising the die 105b by advancing the falling edge time by the predetermined value and generates a high level for the signal intended to the first group of dies comprising the die 105c by delaying the rising edge time by the predetermined value.

After that the processor 300 returns to step S61.

Naturally, many modifications can be made to the embodiments of the invention described above without departing from the scope of the present invention.

The invention claimed is:

1. A system comprising a multi-die power module composed of dies and a controller receiving plural consecutive input patterns for activating the dies of the multi-die power module, the input patterns being composed of rising edges and falling edges, characterized in that the dies are grouped into first, second and third groups of at least one die and in that the controller comprises:
   means for advancing the falling edge time of a gate signal for the first group of at least one die by a predetermined value,
   means for delaying the rising edge time of a gate signal for the second group of at least one die by the predetermined value,
   means for delaying the rising edge time of a gate signal for the third group of at least one die by the predetermined value and for advancing the falling edge time of the gate signal for the third group of at least one die by the predetermined value.

2. The system according to claim 1, wherein the system further comprises means for adjusting the number of dies or groups of dies according to current requirement and maximum current driving capability of the dies of the multi-die power module.

3. The system according to claim 1, wherein the system further comprises means for changing, at each input pattern for activating the dies of the multi-die power module, at least one of said gate signals of which the rising edge time and/or the falling edge time is advance or delayed.

4. The system according to claim 3, wherein the gate signals of which the rising edge time and/or the falling edge time are advanced or delayed, are changed on a round robin basis.

5. The system according to claim 1, wherein the rising edge time and/or the falling edge time are, at a minimum, dependent of the commutations properties of the dies and are at least ten times smaller than the total conduction time of the die.

6. A method for controlling the operation of a multi-die power module composed of groups of dies, characterized in that the dies are grouped into first, second and third groups of at least one die and in that the method comprises the steps executed by a controller of:
   receiving plural consecutive input patterns for activating the dies of the multi-die power module, wherein the input patterns being composed of rising edges and falling edges,
   advancing the falling edge time of a gate signal for the first group of at least one die by a predetermined value,
   delaying the rising edge time of a gate signal for the second group of at least one die by the predetermined value,
   delaying the rising edge time of a gate signal for the third group of at least one die by the predetermined value and for advancing the falling edge time of the gate signal for the third group of at least one die by the predetermined value.

7. The method according to claim 6, wherein the method further comprises the step of adjusting the number of dies or group of dies according to current requirement and maximum current driving capability of the dies of the multi-die power module.

8. The method according to claim 6, wherein the method further comprises the step of changing, at each input pattern for activating the dies of the multi-die power module, at least one of said gate signals of which the rising edge time and/or the falling edge time is advanced or delayed.

9. The method according to claim 8, wherein the gate signals of which the rising edge time and/or the falling edge time are advanced or delayed, are changed on a round robin basis.

10. The method according to claim 6, wherein the rising edge time and/or the falling edge time are, at a minimum, dependent of the commutations properties of the dies and are at least ten times smaller than the total conduction time of the die.

* * * * *